US009952610B1

(12) United States Patent
Yokoyama et al.

(10) Patent No.: US 9,952,610 B1
(45) Date of Patent: Apr. 24, 2018

(54) CLAMP CIRCUIT TO SUPPRESS REFERENCE VOLTAGE VARIATION IN A VOLTAGE REGULATOR

(71) Applicants: Katsuhiro Yokoyama, Tama (JP); Yoichi Takano, Tama (JP)

(72) Inventors: Katsuhiro Yokoyama, Tama (JP); Yoichi Takano, Tama (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/616,300

(22) Filed: Jun. 7, 2017

(51) Int. Cl.

| | |
|---|---|
| ***G05F 1/565*** | (2006.01) |
| ***G05F 1/46*** | (2006.01) |
| ***H03K 5/08*** | (2006.01) |
| ***G05F 1/575*** | (2006.01) |
| ***G05F 1/595*** | (2006.01) |

(52) U.S. Cl.
CPC .............. *G05F 1/468* (2013.01); *G05F 1/575* (2013.01); *G05F 1/595* (2013.01); *H03K 5/08* (2013.01)

(58) Field of Classification Search
CPC .......... G05F 1/468; G05F 1/575; G05F 1/595; G05F 5/00; H03K 5/08
See application file for complete search history.

(56) References Cited

U.S. PATENT DOCUMENTS

| | | | | |
|---|---|---|---|---|
| 5,686,820 A * | 11/1997 | Riggio, Jr. | G05F 1/575 323/273 |
| 6,525,596 B2 | 2/2003 | Hosono et al. | |
| 8,531,237 B2 | 9/2013 | Aisu | |
| 2009/0273237 A1* | 11/2009 | Inoue | G05F 1/575 307/10.1 |
| 2013/0027011 A1* | 1/2013 | Shih | G05F 1/575 323/282 |
| 2014/0176098 A1* | 6/2014 | Fang | G05F 1/46 323/280 |
| 2016/0299518 A1* | 10/2016 | Iwata | G05F 1/468 |
| 2016/0334817 A1* | 11/2016 | Takano | G05F 1/468 |
| 2017/0031374 A1* | 2/2017 | Su | G05F 1/575 |
| 2017/0155315 A1* | 6/2017 | Yasusaka | G05F 1/468 |
| 2017/0293313 A1* | 10/2017 | Wang | G05F 1/575 |

FOREIGN PATENT DOCUMENTS

| | | |
|---|---|---|
| JP | 2001084043 A | 3/2001 |
| JP | 2011022689 A | 2/2011 |

* cited by examiner

*Primary Examiner* — Jue Zhang
*Assistant Examiner* — Jye-June Lee
(74) *Attorney, Agent, or Firm* — Holtz, Holtz & Volek PC

(57) ABSTRACT

A semiconductor integrated circuit includes a control transistor, a control circuit, a reference circuit, a current source, and a stabilizing circuit including a first transistor whose base is connected to a node to receive the reference voltage. The reference circuit includes series-connected second transistor and first and second resistors, third and fourth transistors and third and fourth resistors, and fifth and sixth transistors. The fifth transistor has connected base and collector, which base is connected to a base of the third transistor, the second transistor has a base connected to a node between third and fourth transistors, fourth and sixth transistors have bases connected to a first node between first and second resistors or a second node between second transistor and first resistor, a potential at the first or second node is the reference voltage, and a gain is determined depending on a resistance of the first resistor.

3 Claims, 5 Drawing Sheets

PRIOR ART

CLAMP CIRCUIT TO SUPPRESS REFERENCE VOLTAGE VARIATION IN A VOLTAGE REGULATOR

BACKGROUND OF THE INVENTION

Field of the Invention

The present invention relates to a reference voltage circuit in a DC power supply device, in specific, a technique effectively applicable to a semiconductor integrated circuit for controlling a series regulator, where the semiconductor integrated circuit is equipped with a reference voltage circuit including bipolar transistors.

Description of the Related Art

A typical example of the DC power supply devices is a series regulator that controls a control transistor to lower the input voltage depending on the output voltage and outputs a predetermined voltage. Series regulators equipped with circuitry including bipolar transistors are advantageous to systems sensitive to noise (e.g., sensitive image sensors) among systems powered by such series regulators.

A typical semiconductor integrated circuit included in and controlling a series regulator is provided with an error amplifier that detects the potential difference between a feedback voltage variable corresponding to on the output voltage and a predetermined reference voltage and controls a control transistor depending on the potential difference.

With reference to FIG. 8, some traditional semiconductor integrated circuits for regulators each includes a reference voltage circuit provided in a chip to generate a (fixed) reference voltage to be fed to an error amplifier.

Furthermore, there is recently known a technique to design semiconductor integrated circuits for regulators which can readily generate output voltages of multiple-step values (e.g., 1.5V, 2.0V, 2.5V, . . . ) and are thus applicable to various systems, for example, by adjusting the resistance values of voltage dividing resistors (R6 or R7 in FIG. 8) for generating a feedback voltage.

In the system including the reference voltage circuit 12 as illustrated in FIG. 8 and generating plural output voltages (ranking of products) by switching the resistance value of a voltage dividing circuit (resistor R6 or R7) for generating a feedback voltage, an error amplifier 11, an output-voltage control transistor Q0, and the voltage dividing circuit (resistors R6 and R7) function as a gain-switching amplifier. The gain G in this configuration varies depending on the switched resistance value of the resistor R6 or R7, as represented in the following expression:

$$G=V\text{out}/V\text{ref}=1+(R7/R6).$$

Such a variation in the gain G or rank of the output voltage unintentionally changes the level of noise contained in the output of the reference voltage circuit 12.

In order to reduce the noise in the voltage output from the reference voltage circuit, a constant voltage circuit (a series regulator) is provided with a low-pass filter between the reference voltage circuit and an error amplifier (refer to PTL 1: Japanese Patent Application Laid-Open Publication No. 2011-22689). The circuit disclosed in PTL 1, however, includes MOS transistors less advantageous in a noise reduction than bipolar transistors. PTL 1 does not mention the switching of the output voltage or the accompanying problems.

PTL 2 (Japanese Patent Application Laid-Open Publication No. 2001-84043) discloses using a bandgap reference voltage circuit in a semiconductor integrated circuit for controlling a series regulator, the semiconductor integrated circuit being composed of bipolar transistors. In PTL 2, however, a power supply circuit (corresponding to a bias circuit of the present invention) for generating an operating voltage to be fed to the reference voltage circuit is devised so as to improve the ripple rejection capability. PTL 2 does not mention the switching of the output voltage or the accompanying problems.

SUMMARY OF THE INVENTION

An object of the present invention, which has been accomplished on the above-described background, is to provide a semiconductor integrated circuit for a regulator without a significant variation in noise level of the output voltage even when the output voltage is switched.

Another object of the present invention is to provide a semiconductor integrated circuit for a regulator without a variation in output voltage regardless of a variation in input voltage.

To achieve the above objects, a semiconductor integrated circuit for a regulator includes: a control transistor connected between an input terminal to which a DC voltage is applied and an output terminal; a control circuit to control the control transistor such that an output voltage becomes a predetermined voltage depending on a potential difference between a feedback voltage corresponding to the output voltage and a predetermined reference voltage; a reference voltage circuit to generate the reference voltage; a current source circuit to feed an operating current for the reference voltage circuit; and an operating-current stabilizing circuit to prevent a variation in the operating current for the reference voltage circuit regardless of a variation in the voltage input to the input terminal. The operating-current stabilizing circuit includes a first transistor connected in series between a power supply line through which the operation current is fed to the reference voltage circuit and a ground line leading to a ground potential point, the first transistor including a base terminal connected to a node to which the reference voltage is output. The reference voltage circuit includes: a second transistor, a first resistor, and a second resistor connected in series between the power supply line and the ground line; a third transistor, a fourth transistor, a third resistor, and a fourth resistor connected in series between the power supply line and the ground line; and a fifth transistor and a sixth transistor connected in series between the power supply line and a connection node between the third resistor and the fourth resistor, wherein the fifth transistor has a base terminal and a collector terminal connected to each other to function as a current-voltage converter, the third transistor has a base terminal connected to the base terminal of the fifth transistor, the second transistor has a base terminal connected to a connection node between the third transistor and the fourth transistor, the fourth transistor and the sixth transistor each have a base terminal connected to a connection node between the first resistor and the second resistor or a connection node between the second transistor and the first resistor, an electric potential at the connection node between the second transistor and the first resistor or at the connection node between the first resistor and the second resistor is taken out as the reference voltage, and a gain is determined depending on a resistance value of the first resistor.

BRIEF DESCRIPTION OF THE DRAWINGS

The present invention will be described through the detailed description below and the accompanying drawings. Such description and drawings should not be construed to limit the present invention.

DESCRIPTION OF THE PREFERRED EMBODIMENTS

Preferred embodiments of the present invention will now be described with reference to the accompanying drawings.

Figure 1:
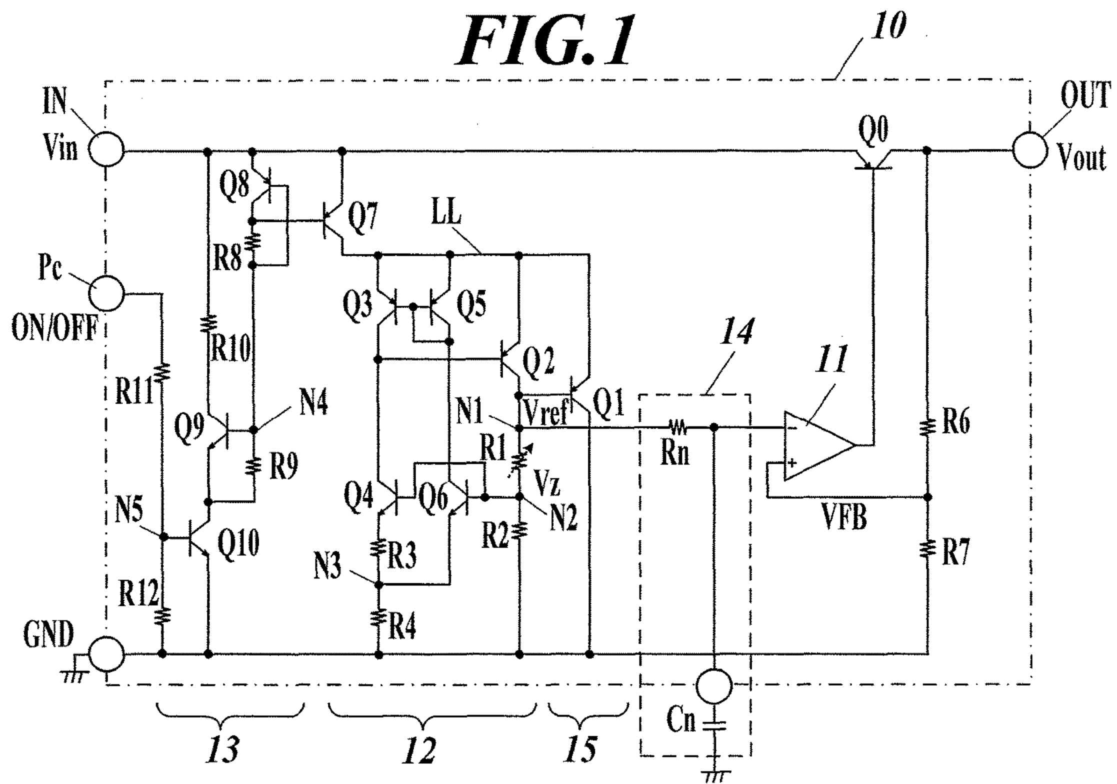
FIG. 1 is a circuit diagram illustrating a series-regulator controlling IC including a variable reference voltage circuit according to an embodiment of the present invention.

FIG. 1 illustrates a series regulator (e.g., an LDO regulator) according to an embodiment, to which the present invention is applied. The elements encompassed by the dashed and single-dotted line in FIG. 1 are disposed on a single semiconductor chip and configure a semiconductor integrated circuit 10 (hereinafter referred to as "regulator IC 10") for controlling the regulator, although this configuration should not be construed to limit the present invention.

The regulator IC 10 in the embodiment includes an output-voltage control transistor Q0 composed of a PNP bipolar transistor connected between a voltage input terminal IN that receives a DC voltage Vin from a DC voltage source and an output terminal OUT. The regulator IC 10 further includes bleeder resistors R6 and R7 for dividing the output voltage Vout connected in series between the output terminal OUT and a ground terminal GND that receives a ground electric potential. The dividing operation at the bleeder resistors R6 and R7 generates a feedback voltage VFB, which is fed back to the non-inverting input terminal of an error amplifier 11 for controlling the base terminal of the output-voltage control transistor Q0.

The error amplifier 11 controls the output-voltage control transistor Q0 depending on the potential difference between the feedback voltage VFB and a reference voltage Vref, to make the output voltage Vout at a desired electric potential. This feedback control allows the series regulator in the embodiment to maintain the output voltage Vout at a predetermined voltage. The electric potential of the output voltage Vout is set by the magnitude of the reference voltage Vref from a reference voltage circuit 12 and the ratio of the resistances of the bleeder resistors R6 and R7. The output terminal OUT is connected to an external output capacitor for stabilizing the output voltage Vout.

The regulator IC 10 in the embodiment further includes a terminal Pc that receives control signals ON/OFF for turning on or off the regulator from the outside, the bandgap reference voltage circuit 12 for generating the reference voltage Vref, a bias circuit 13 for generating an operating current to be fed to the reference voltage circuit 12, and a low-pass filter 14 disposed between the reference voltage circuit 12 and the error amplifier 11 to reduce the noise in the output from the reference voltage circuit 12.

The operation of the bias circuit 13 is controlled by the control signals ON/OFF input to the terminal Pc from the outside thereof. The low-pass filter 14 includes an on-chip resistor Rn disposed on the semiconductor substrate and an external capacitor Cn connected to an external terminal disposed on the chip.

The reference voltage circuit 12 and the bias circuit 13 will now be described according to the embodiment illustrated in FIG. 1.

The reference voltage circuit 12 in the embodiment includes a PNP transistor Q7 having an emitter terminal connected to the voltage input terminal IN and a collector terminal connected to a power supply line LL. The base current in the PNP transistor Q7 is controlled by the bias circuit 13. The reference voltage circuit 12 is fed with the operating current through the PNP transistor Q7 and the power supply line LL.

The reference voltage circuit 12 further includes a PNP transistor Q2 and resistors R1 and R2 connected in series between the power supply line LL and a ground line leading to the ground terminal GND; a PNP transistor Q3, an NPN transistor Q4, and resistors R3 and R4 connected in series between the power supply line LL and the ground line (leading to the ground terminal GND); and a PNP transistor Q5 and an NPN transistor Q6 connected in series between the power supply line LL and a connection node N3 between the resistors R3 and R4.

The transistor Q5 has a base terminal and a collector terminal connected to each other and thus functions as a current-voltage converter. The transistors Q3 and Q5 are in common base connection with each other and thus function as a current mirror circuit. The base terminal of the transistor Q2 is connected to the collector terminal of the transistor Q3 to introduce a current to the resistors R1 and R2. The base terminals of the transistors Q6 and Q4 are both connected to a connection node N2 between the resistors R1 and R2. The ratio of the sizes of the transistors Q6 to Q4 is 1 to 8 (Q6<Q4) to provide an offset voltage.

In the reference voltage circuit 12 in the embodiment, the offset voltage of the transistors Q6 and Q4 and the resistor R3 control the base current in the transistor Q2, such that the base potential of the transistors Q6 and Q4 (i.e., the electric potential at the connection node N2) equals a voltage Vz based on the bandgap of a semiconductive material (silicon) of the substrate. The control of the base current in the transistor Q2 leads to the control of the emitter current in the transistor Q2. The resistors R1 and R2 generate a certain reference voltage Vref at a node N1 through amplification of the bandgap voltage Vz (i.e., the electric potential at the connection node N2) depending on the ratio of the resistances of the resistors R1 and R2. In detail, the reference voltage Vref at a value calculated by multiplying the bandgap voltage Vz by (R1+R2)/R2 (i.e., Vref=Vz×(R1+R2)/R2) is generated at the node N1 and output.

In the regulator IC 10 in the embodiment, the resistance value of the resistor R1 among the resistors R1 and R2 included in the reference voltage circuit 12 can be switched, for example, by changing the mask for forming the wirings. The regulator IC 10 can thus be designed to be at a certain rank and output any of the plural-stage voltages Vout (e.g., 1.5 V, 2.0 V, 2.5 V, . . . ). In other words, the resistor R1 serves as a variable resistor. Because of the variable resistor R1, the reference voltage Vref generated at the node N1 is also variable. The reference voltage circuit 12 thus functions as a variable reference voltage source.

The devices and manufacturing processes are designed such that whereas the resistance value of the resistor R1 is switched to determine the rank of the output voltage Vout, the resistance value of one of the resistors R6 and R7 for dividing the output voltage Vout into the feedback voltage VFB is trimmed (fine adjustment) to ensure the accuracy of the output voltage Vout. Although the resistance value of the resistor R1 may also be trimmed to adjust the output voltage Vout to a predetermined value, the trimming of the resistance value of the resistor R6 (or R7) can achieve more accurate output voltage Vout than the trimming of the resistance value of the resistor R1 because the resistance value of the resistor R1 directly affects the gain of the reference voltage circuit 12.

The bias circuit 13 includes a PNP transistor Q8, resistors R8 and R9, and an NPN transistor Q10 connected in series between the voltage input terminal IN and the ground line; a resister R10 and an NPN transistor Q9 connected in series between the voltage input terminal IN and a connection node between the resistor R9 and the transistor Q10; and resistors R11 and R12 connected in series between the terminal Pc that receives control signals ON/OFF and the ground line.

The base terminal of the transistor Q10 is connected to a connection node N5 between the resistors R11 and R12, whereas the base terminal of the transistor Q9 is connected to a connection node N4 between the resistors R8 and R9.

The collector terminal of the transistor Q8 is connected to the base terminal of the transistor Q7. The bias circuit 13 is turned on or off by the control signals ON/OFF. In the on-state, a bias voltage having a predetermined electric potential is generated at the collector terminal of the transistor Q8 and causes a base current to flow in the transistor Q7, so that the transistor Q7 feeds an operating current to the reference voltage circuit 12.

In detail, if a not-shown external system controller (e.g., a microprocessor) sets the control signals ON/OFF at an electric potential of 5V, for example, a collector current flows in the transistor Q10 and activates the bias circuit 13, and thereby causes a current to flow in the transistor Q7 for feeding a current. The bias circuit 13 and the transistor Q7 thus function as a current source circuit to generate the operating current for the reference voltage circuit 12.

The regulator IC 10 in the embodiment is further equipped with a clamp circuit 15 including a PNP transistor Q1 connected between the power supply line LL and the ground line (leading to the ground terminal CND). The clamp circuit 15 can suppress a variation in operating current for the reference voltage circuit 12 regardless of a variation in DC voltage Vin applied to the voltage input terminal IN. For example, the operating current fed from the transistor Q7 to the reference voltage circuit 12 increases with increased input voltage Vin, but the current flowing in the clamp circuit 15 concurrently increases to suppress a change in the operating current for the reference voltage circuit 12. Meanwhile, the operating current fed from the transistor Q7 to the reference voltage circuit 12 decreases with decreased input voltage Vin, but the current flowing in the clamp circuit 15 concurrently decreases to suppress a change in the operating current for the reference voltage circuit 12. In other words, the clamp circuit 15 can clamp the operating current fed to the reference voltage circuit 12 to prevent the operating current from varying with the input voltage Vin.

The operations of the reference voltage circuit 12 and the clamp circuit 15 will now be explained in more detail.

An increase in the input voltage Vin increases the current flowing in the transistor Q7, so that the electric potential of the power supply line LL rises and thus increases the collector current in the transistor Q2, resulting in higher electric potentials at the nodes N1 and N2. The collector currents in the transistors Q6 and Q4 thus tend to increase. An increase in the collector current in the transistor Q4 is smaller than that in the transistor Q6 because of the limitation by the offset voltage of the transistors Q4 and Q6 and the resistor R3 connected between the emitter terminals of the transistors Q4 and Q6. An increase in the collector current in the transistor Q6 draws a current through the diode-connected transistor Q5, resulting in an increase in current in the transistor Q5 and an increase in current in the transistor Q3 that configures the current mirror circuit with the transistor Q5. The base current in the transistor Q2 then decreases because the collector current in the transistor Q4 is limited by the resistor R3. The collector current in the transistor Q2 decreases with decrease of the base current in the transistor Q2, and thus suppresses an increase in the electric potentials at the nodes N1 and N2. This operation suppresses a variation in the reference voltage Vref.

If the current flowing in the transistor Q7 increases with increase of the input voltage Vin, the electric potential of the power supply line LL tends to rise. Because the operation of the reference voltage circuit 12 suppresses a variation in the reference voltage Vref at the node N1, the voltage between the emitter and base terminals of the transistor Q1 tends to increase. The collector current in the transistor Q1 then increases due to Vbe-Ic characteristics of the transistor, and thus lowers the voltage of the power supply line LL. The voltage of the power supply line LL is stabilized at the sum of the voltage at the node N1 and the voltage Vf between the emitter and base terminals of the transistor Q1.

A decrease in the input voltage Vin decreases the current flowing in the transistor Q7, and thereby induces the operation opposite to the above-explained operation. In detail, the electric potentials at the nodes N1 and N2 in the reference voltage circuit 12 come close to lowering, but prevented from lowering by an increase in the collector current in the transistor Q2 accompanied by an increase in the base current in the transistor Q2. Although the voltage between the emitter and base terminals of the transistor Q1 in the clamp circuit 15 tends to decrease as the input voltage Vin decreases, the collector current in the transistor Q1 decreases due to Vbe-Ic characteristics of the transistor, and thus raises the voltage of the power supply line LL. This operation suppresses a variation in the power supply voltage applied to the reference voltage circuit 12.

As explained above, the clamp circuit 15 can clamp the operating current for the reference voltage circuit 12 to prevent the operating current from varying with the input voltage Vin. In other words, the clamp circuit 15 has a function to clamp the power supply voltage applied to the reference voltage circuit 12 to prevent the power supply voltage from varying with the input voltage Vin, because a variation in the current flowing in the clamp circuit 15 in response to a variation in the input voltage Vin stabilizes the electric potential of the power supply line LL for feeding the power supply voltage to the reference voltage circuit 12.

The above-explained operation of the clamp circuit 15 suppresses a variation in the reference voltage Vref generated at the reference voltage circuit 12 regardless of a variation in the input voltage Vin, and reduces ripples in the output voltage Vout. In other words, the clamp circuit 15 (transistor Q1) is capable of ripple rejection for the output voltage Vout.

Figure 2:
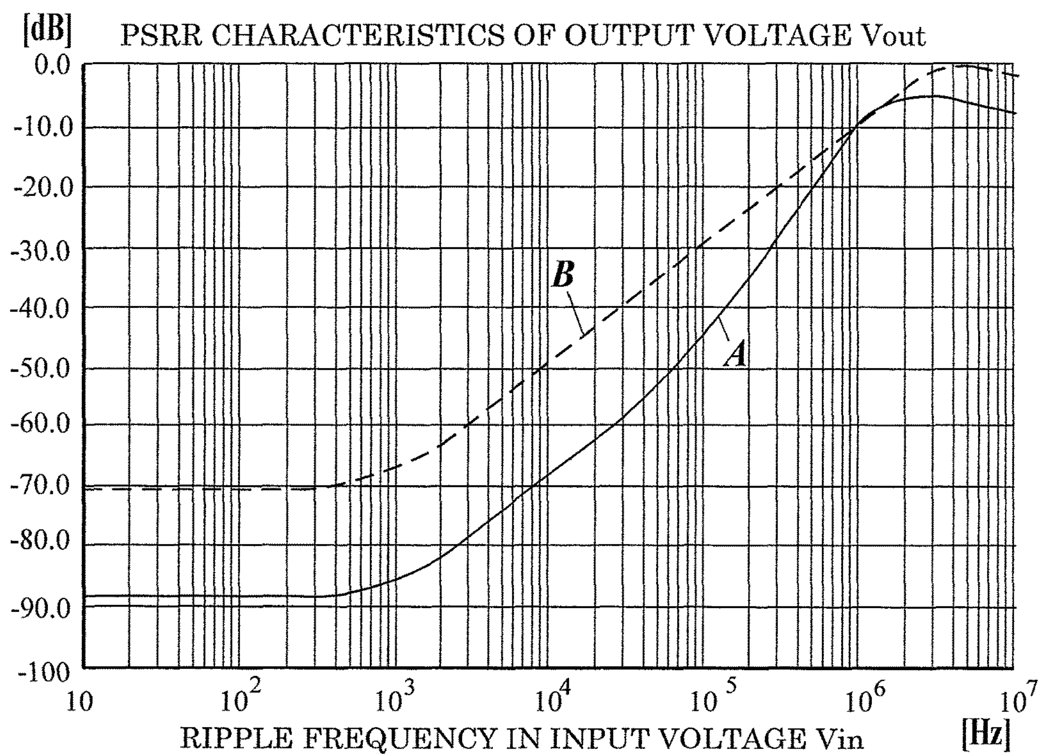
FIG. 2 is a graph illustrating the difference in PSRR characteristics of amplifier circuits between the series-regulator controlling ICs (FIG. 1) with and without a clamp circuit according to the embodiment.

FIG. 2 illustrates the difference in power supply rejection ratio (PSRR) characteristics of the output voltage Vout between the regulator ICs 10 in the embodiment with and without the clamp circuit 15 acquired by simulation. In FIG. 2, the x axis indicates the frequency of the ripples in the input voltage Vin, the solid line A indicates the PSRR characteristics with the clamp circuit 15, and the dashed line B indicates the PSRR characteristics without the clamp circuit 15. FIG. 2 demonstrates that the clamp circuit 15 can significantly improve the ripple rejection capability of the reference voltage circuit 12, in particular, by 20 dB in the range of DC to 1 kHz.

Figure 3:
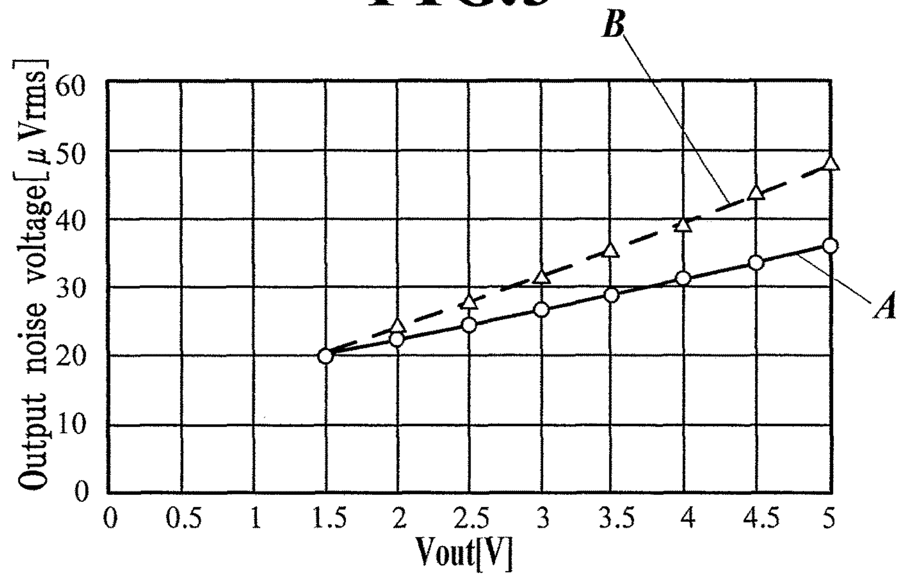
FIG. 3 is a graph illustrating the relation between output voltage and noise compared between a traditional series-regulator controlling IC and a series-regulator controlling IC according to the embodiment of the present invention.
Figure 8:
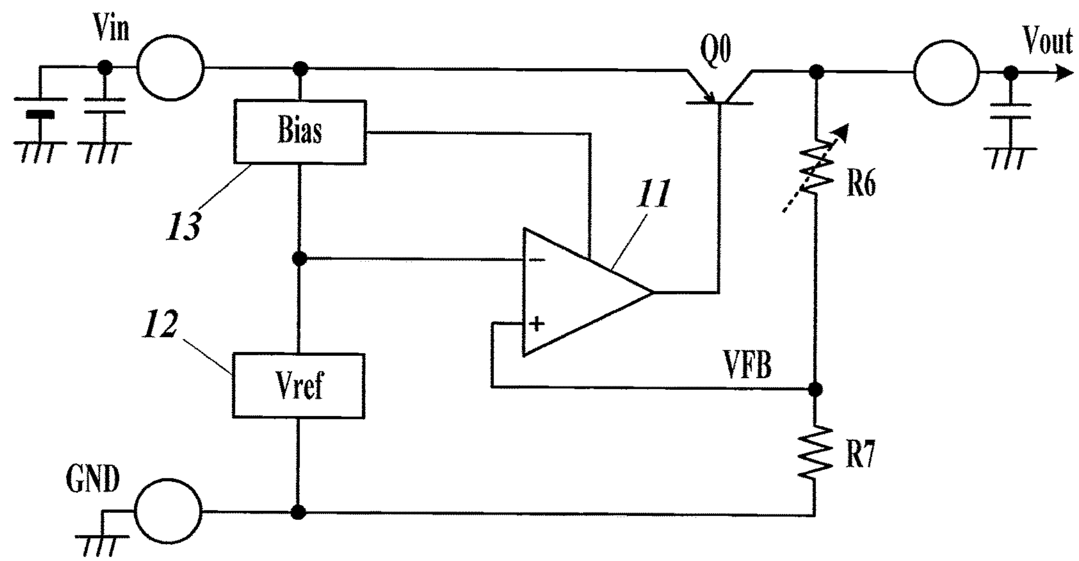
FIG. 8 is a circuit diagram illustrating an example traditional series-regulator controlling IC.

The regulator IC 10 in the embodiment is equipped with the low-pass filter 14 between the reference voltage circuit 12 and the error amplifier 11, and the resistors R1 and R2 for adjusting the gain in the output part of the bandgap reference voltage circuit 12. The switching of the resistance value of the resistor R1 switches the electric potential of the output voltage Vout. As illustrated with the solid line A in FIG. 3, the scheme in the embodiment involving adjustment of the resistance value of the resistor R1 can reduce a variation in noise level of the output voltage Vout depending on the rank of the product, compared to a traditional scheme involving adjustment of the resistance value of the resistor R6 among the resistors R6 and R7 of the voltage dividing circuit for generating the feedback voltage VFB to switch the electric potential of the output voltage Vout. The dashed line B in FIG. 3 indicates that the level of the noise in the output voltage Vout caused by the switching of the output voltage Vout varies depending on the rank of the product (x axis) in a traditional regulator IC illustrated in FIG. 8.

Figure 4:
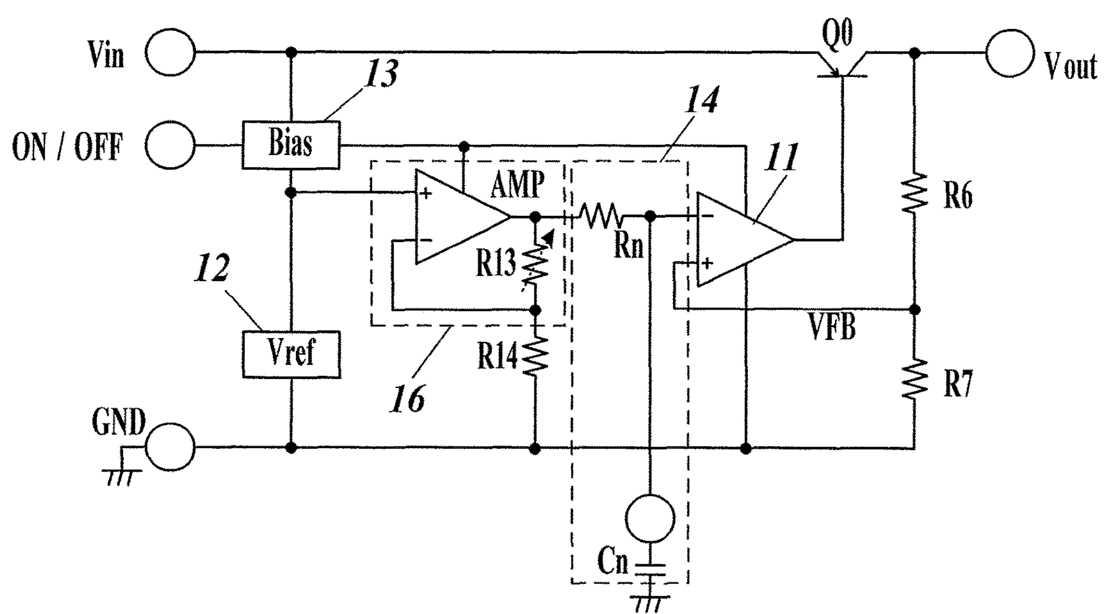
FIG. 4 is a circuit diagram illustrating an example series-regulator controlling IC including a variable reference voltage circuit and an amplifier circuit independent from each other.

In order to switch the electric potential of the output voltage Vout, as illustrated in FIG. 4, the regulator IC may further include a variable-gain amplifier circuit 16 including a differential amplifier AMP and voltage-dividing resistors R13 and R14 downstream of the fixed reference voltage circuit 12. The regulator IC illustrated in FIG. 4, however, has a larger area than the regulator IC 10 in the embodiment illustrated in FIG. 1.

Figure 5:
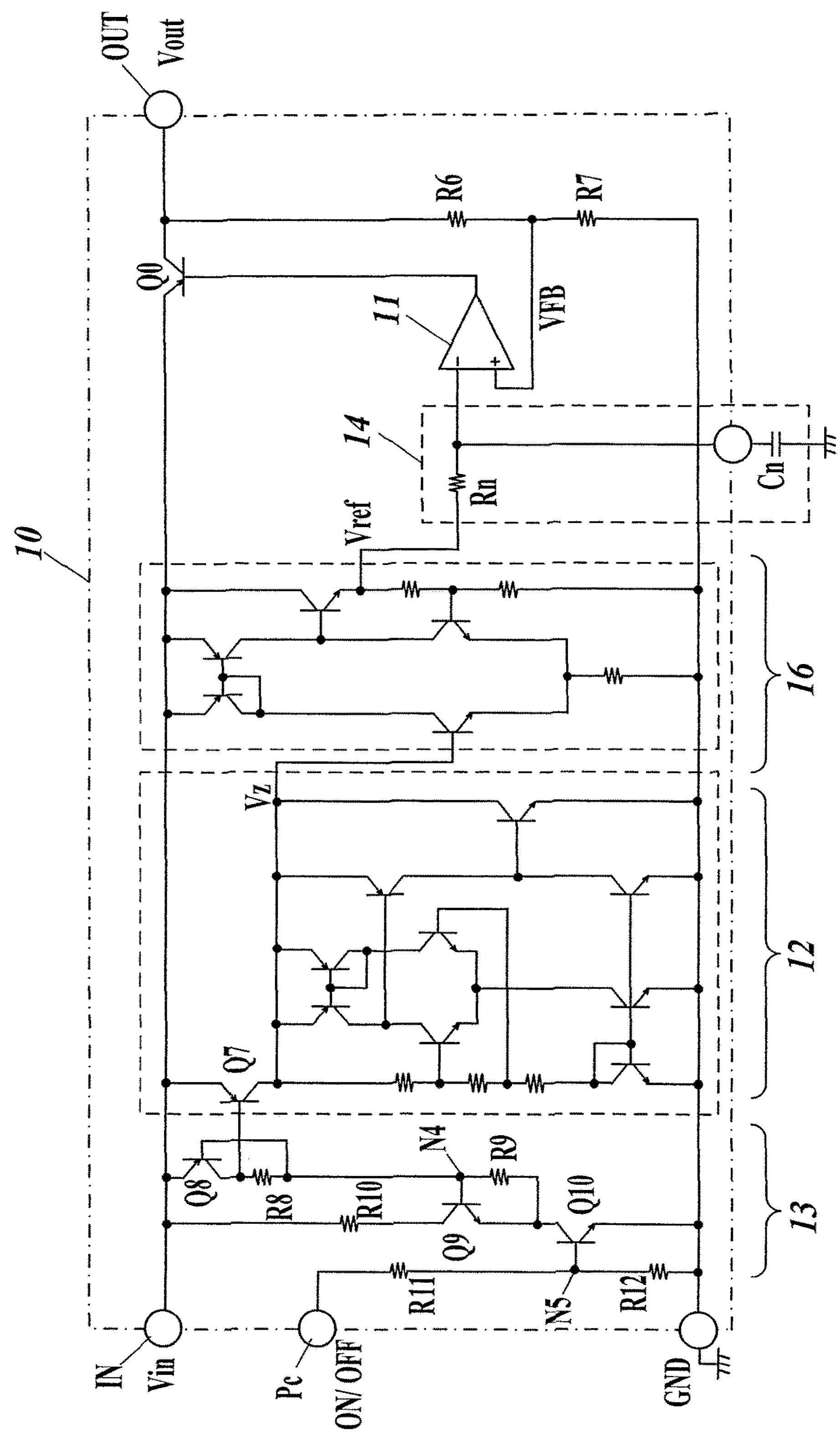
FIG. 5 is a circuit diagram illustrating an example series-regulator controlling IC equipped with a variable reference voltage circuit including a typical traditional reference voltage circuit and amplifier circuit.

The individual elements of the circuitry in FIG. 4 are illustrated in FIG. 5. In FIG. 5, reference numeral 12 indicates the reference voltage circuit, reference numeral 13 indicates the bias circuit, and reference numeral 16 indicates the variable-gain amplifier circuit. Whereas the variable reference voltage circuit 12 in FIG. 1 requires ten elements (i.e., four PNP transistors, two NPN transistors, and four resistors), the regulator IC in FIG. 4 requires 21 elements (four PNP transistors, six NPN transistors, and three resistors in the fixed reference voltage circuit 12; and two PNP transistors, three NPN transistors, and three resistors in the amplifier circuit 16) as illustrated in FIG. 5. That is, the regulator IC illustrated in FIG. 4 requires further eleven elements as compared to the regulator IC 10 in the embodiment. The regulator IC 10 in the embodiment (FIG. 1) thus requires a reduced number of elements and thus a smaller circuit area or chip size compared to the regulator IC in FIG. 4.

Figure 6:
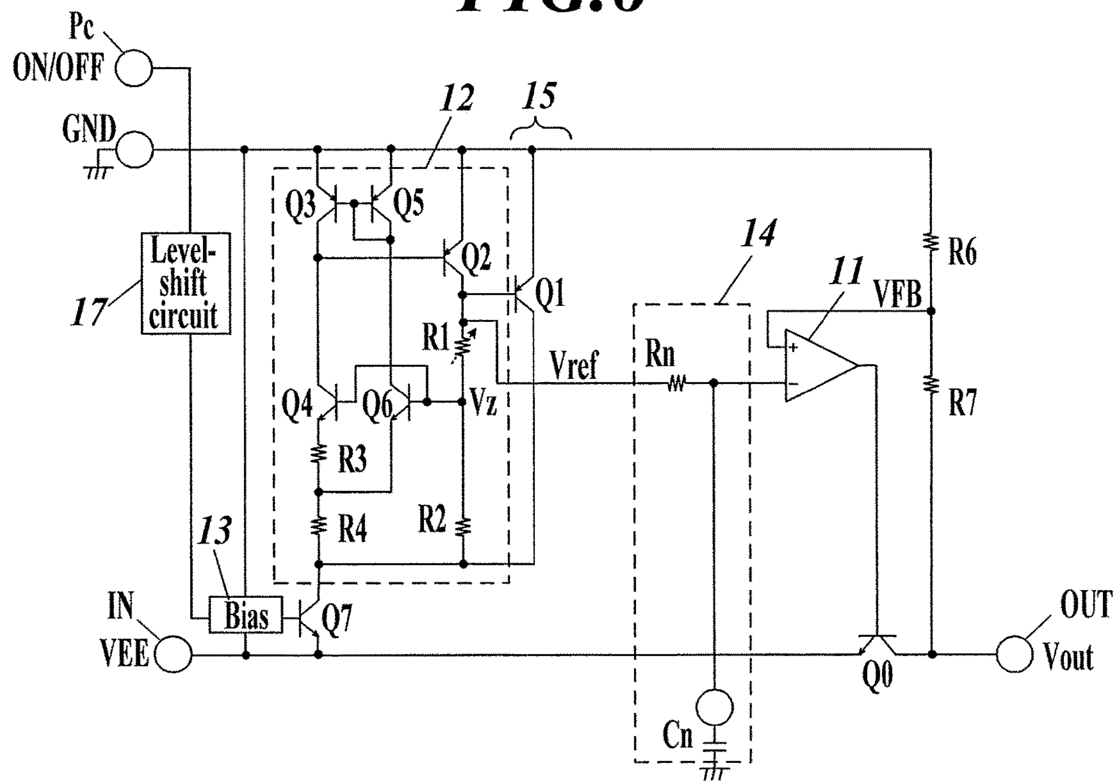
FIG. 6 is a circuit diagram illustrating a first modification of the controlling IC where the present invention is applied to a series regulator for a negative power supply.
Figure 7:
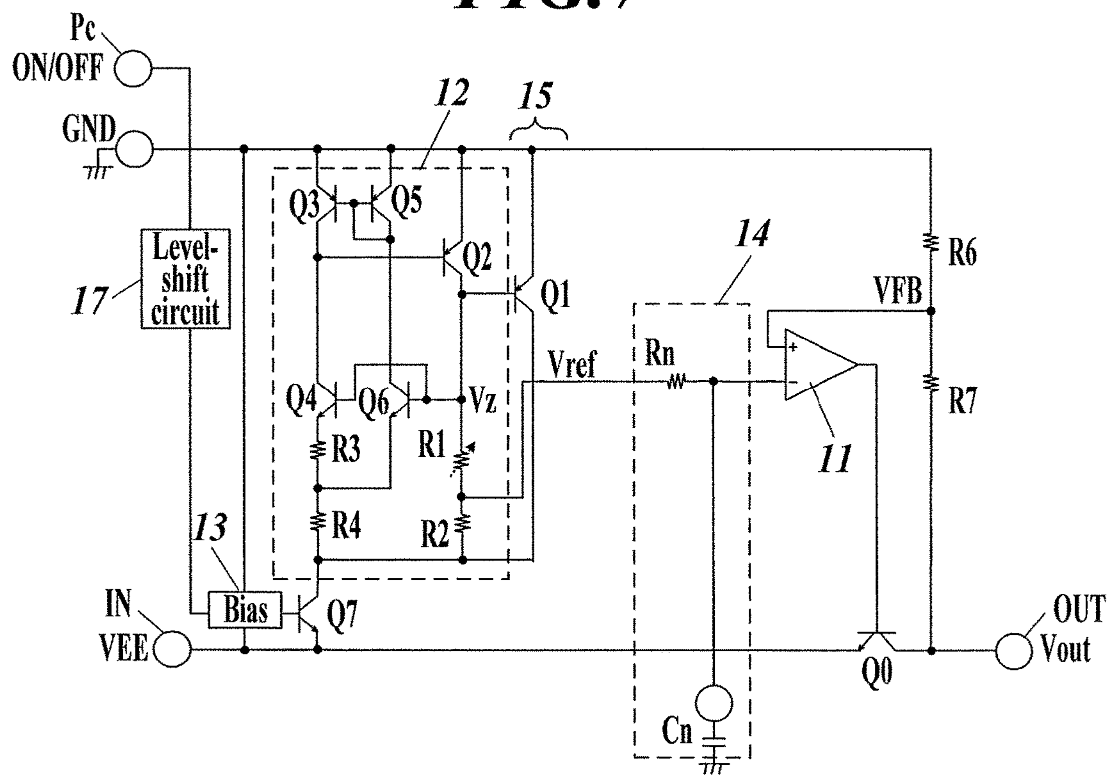
FIG. 7 is a circuit diagram illustrating a second modification of the controlling IC where the present invention is applied to the series regulator for the negative power supply.

FIGS. 6 and 7 illustrate modifications of the series-regulator IC in the embodiment in FIG. 1.

These modifications assume the present invention applied to an IC constituting a regulator for a negative power supply.

The regulator IC for the negative power supply in the modification in FIG. 6 differs from the regulator IC 10 for a positive power supply in FIG. 1 in that a negative power supply voltage VEE is input to the voltage input terminal IN, different NPN bipolar transistors of conductivity type are used as the output-voltage control transistor Q0 and the transistor Q7 for feeding the operating current to the reference voltage circuit 12, and a level shift circuit 17 is provided for shifting the level of the control signals ON/OFF input to the terminal Pc from the range of GND (0 V) to Vcc into the range of VEE to GND (0 V). The bias circuit 13 may have a configuration identical to that in FIG. 1.

In the regulator IC in this modification, the reference voltage circuit 12 and the clamp circuit 15 perform operations identical to those in the regulator IC 10 in FIG. 1. The regulator IC in the modification can thus reduce a variation in noise level of the output voltage Vout regardless of the switching of output voltage Vout and requires a smaller area, like the regulator IC 10 in FIG. 1. In addition, the clamp circuit 15 is capable of ripple rejection for the output voltage Vout.

In another modification illustrated in FIG. 7, the reference voltage Vref is generated by dividing the bandgap voltage Vz at the resistors R1 and R2, instead of amplifying the bandgap voltage Vz at the resistors R1 and R2 to generate the reference voltage Vref. The other configuration is identical to that in the modification in FIG. 6. The regulator IC in FIG. 7 can compress the noise contained in the bandgap voltage Vz through dividing the bandgap voltage Vz into the reference voltage Vref at the resistors R1 and R2, and thus bring about advantageous noise-reduction effects in addition to the effects of the regulator IC in the modification in FIG. 6.

The above-described embodiments should not be construed to limit the present invention achieved by the present inventors. For example, the characteristic configuration of the modification in FIG. 7 can be applied to the regulator IC 10 in FIG. 1.

Although the clamp circuit 15 for preventing the operating current fed to the reference voltage circuit 12 from varying with the input voltage is connected in parallel to the reference voltage circuit 12 in the embodiment, a circuit having equal functions may alternatively be connected in series to the reference voltage circuit 12.

The external capacitor Cn included in the low-pass filter 14 in the embodiment may be replaced with an on-chip capacitor Cn.

The above means can achieve a regulator with which a noise level of the output voltage does not drastically vary even when the output voltage is switched. Furthermore, the circuit generating a reference voltage and the circuit amplifying the reference voltage are integrally configured as a variable reference voltage circuit. This requires a reduced number of elements, leading to a reduction in the exclusive area of the circuit or the chip size. In addition, the operating current stabilizing circuit for reducing a variation in operating current for the reference voltage circuit can stabilize the reference voltage generated at the reference voltage circuit regardless of a variation in input voltage, and can thus provide ripple rejection capability of suppressing a variation in output voltage regardless of a variation in input voltage.

The operating current stabilizing circuit includes the first transistor connected between the power supply line for feeding the operating current to the reference voltage circuit and the ground line connected to the ground potential point, and the base terminal of the first transistor is connected to the node that receives the reference voltage. The operating current fed to the reference voltage circuit can be thus prevented from varying with variation of the input voltage, and such a circuit can be achieved only with a simple configuration including a reduced number of elements.

It is desirable that a low-pass filter for removing noise from the reference voltage be disposed between the reference voltage circuit and the control circuit.

The low-pass filter can remove noise from the reference voltage generated at the reference voltage circuit. This configuration can reduce a variation degree in noise level of the output voltage in response to the switching of output voltage compared to the traditional configuration of changing the gain of the control circuit. The configuration can thus reduce the difference in noise level among products (series regulators) at different ranks determined based on the electric potentials of their output voltages.

It is desirable that a voltage dividing circuit be provided including resistors that are connected in series and divide the output voltage into the feedback voltage to be fed to the control circuit (error amplifier). In this configuration, an output voltage level is changed stepwise by changing the gain by adjusting the resistance value of the first resistor constituting the reference voltage circuit, and trimming for finely adjusting the output voltage to eliminate a voltage shift caused by a manufacturing variation is achieved by adjusting the resistance value of one of the resistors constituting the voltage dividing circuit which generates the feedback voltage.

The semiconductor integrated circuit for a regulator that includes the variable reference voltage circuit and is capable of stepwise change of the output voltage level can thus achieve high accuracy of output voltage through fine adjustment of the voltage shift in output voltage.

The present invention can provide a semiconductor integrated circuit for a regulator without a significant change in noise level of the voltage output from the reference voltage circuit even when the output voltage is switched. The present invention can also provide a semiconductor integrated circuit for a regulator which can prevent a variation in output voltage regardless of a variation in input voltage. The present invention can achieve a reference voltage circuit generating different reference voltages with a reduced number of elements.

What is claimed is:

1. A semiconductor integrated circuit for a regulator, comprising:

a control transistor connected between an input terminal to which a DC voltage is applied and an output terminal;

a control circuit to control the control transistor such that an output voltage becomes a predetermined voltage depending on a potential difference between a feedback voltage corresponding to the output voltage and a predetermined reference voltage;

a reference voltage circuit to generate the reference voltage;

a current source circuit to feed an operating current for the reference voltage circuit; and an operating-current stabilizing circuit to prevent a variation in the operating current for the reference voltage circuit regardless of a variation in the voltage input to the input terminal, wherein the operating-current stabilizing circuit comprises:

a first transistor connected in series between a power supply line through which the operation current is fed to the reference voltage circuit and a ground line leading to a ground potential point, the first transistor including a base terminal connected to a node to which the reference voltage is output, the reference voltage circuit comprises:

a second transistor, a first resistor, and a second resistor connected in series between the power supply line and the ground line;

a third transistor, a fourth transistor, a third resistor, and a fourth resistor connected in series between the power supply line and the ground line; and a fifth transistor and a sixth transistor connected in series between the power supply line and a connection node between the third resistor and the fourth resistor, wherein the fifth transistor has a base terminal and a collector terminal connected to each other to function as a current-voltage converter, the third transistor has a base terminal connected to the base terminal of the fifth transistor, the second transistor has a base terminal connected to a connection node between the third transistor and the fourth transistor, the fourth transistor and the sixth transistor each have a base terminal connected to a connection node between the first resistor and the second resistor or a connection node between the second transistor and the first resistor, an electric potential at the connection node between the second transistor and the first resistor or at the connection node between the first resistor and the second resistor is taken out as the reference voltage, and a gain is determined depending on a resistance value of the first resistor.

2. The semiconductor integrated circuit for the regulator according to claim 1, further comprising:

a low-pass filter disposed between the reference voltage circuit and the control circuit to remove noise from the reference voltage.

3. The semiconductor integrated circuit for the regulator according to claim 1, further comprising:

a voltage dividing circuit comprising:

resistors connected in series to divide the output voltage into the feedback voltage to be fed to the control circuit, wherein an output voltage level is changed stepwise by changing the gain by adjusting the resistance value of the first resistor, and trimming for finely adjusting the output voltage to eliminate a voltage shift caused by a manufacturing variation is achieved by adjusting the resistance value of one of the resistors constituting the voltage dividing circuit.

* * * * *